(12) United States Patent
Shinozaki et al.

(10) Patent No.: US 7,737,434 B2
(45) Date of Patent: Jun. 15, 2010

(54) LIGHT-EMITTING DIODE ILLUMINATION SOURCE

(75) Inventors: Kenji Shinozaki, Chiba (JP); Kenzo Hanawa, Chiba (JP); Tsuyoshi Kato, Chiba (JP); Yoshiaki Takahashi, Chiba (JP)

(73) Assignee: Showa Denko K.K., Tokyo (JP)

( * ) Notice: Subject to any disclaimer, the term of this patent is extended or adjusted under 35 U.S.C. 154(b) by 614 days.

(21) Appl. No.: 11/667,951

(22) PCT Filed: Nov. 22, 2005

(86) PCT No.: PCT/JP2005/021935

§ 371 (c)(1),
(2), (4) Date: May 17, 2007

(87) PCT Pub. No.: WO2006/057421

PCT Pub. Date: Jun. 1, 2006

(65) Prior Publication Data

US 2008/0093616 A1 Apr. 24, 2008

Related U.S. Application Data

(60) Provisional application No. 60/653,996, filed on Feb. 18, 2005, provisional application No. 60/632,986, filed on Dec. 6, 2004.

(30) Foreign Application Priority Data

Nov. 25, 2004 (JP) .............................. 2004-339801
Feb. 9, 2005 (JP) .............................. 2005-032408

(51) Int. Cl.
*H01L 35/24* (2006.01)
*H01L 29/22* (2006.01)

(52) U.S. Cl. .............................. 257/40; 257/79; 257/98; 257/103

(58) Field of Classification Search .................... 257/40, 257/79, 98, 103; 313/428
See application file for complete search history.

(56) References Cited

U.S. PATENT DOCUMENTS 6,869,697 B2 * 3/2005 Heuer et al. ................. 428/690

(Continued)

FOREIGN PATENT DOCUMENTS

EP 1 398 363 A1 3/2004

OTHER PUBLICATIONS

Sergey Lamanasky et al., "Synthesis and Characterization of Phosphorescent Cyclometalalated Iridium Complexes.", Inorganic Chemistry, American Chemical Society, 2001, p. 1704-1711, vol. 40, No. 7, XP002196399.

(Continued)

*Primary Examiner*—Kenneth A Parker
*Assistant Examiner*—Joseph Nguyen
(74) *Attorney, Agent, or Firm*—Sughrue Mion, PLLC

(57) ABSTRACT

The invention provides light emitting diode illumination source having excellent properties as an illumination source such as a flat spectral distribution in the wavelength region from green to red and a sufficient emission intensity in the red region, comprising a light emitting diode having multiple peaks with a half-value width of 20 nm or more within a range from 480 to 700 nm in a spectral distribution, wherein the minimum of the intensities of the valleys between the peaks in the wavelength range from 480 to 700 nm is 65% or more of the maximum peak intensity in the same range, and an illuminator and a backlight for a liquid crystal display using the illumination source.

11 Claims, 2 Drawing Sheets

U.S. PATENT DOCUMENTS 7,306,856 B2 * 12/2007 Igarashi et al. .............. 428/690

OTHER PUBLICATIONS

Sergey Lamanasky et al., "Cyclometalalated Ir complexes in polymer organic light-emitting devices.", Journal of Applied Physics, American Institute of Physics, Aug. 1, 2002, p. 1570-1575, vol. 92, No. 3, XP012057001.

Yuichiro Kawamura et al., "Energy transfer in polymer electrophosphorescent light emitting devices With single and multiple doped luminescent layers.", Journal of Applied Physics, American Institute of Physics, Jul. 1, 2002, p. 87-93, vol. 92, No. 1, XP012056515.

* cited by examiner

Wavelength (nm)

Wavelength

LIGHT-EMITTING DIODE ILLUMINATION SOURCE

CROSS-REFERENCE TO RELATED APPLICATIONS

This is an application filed pursuant to 35 U.S.C. Section 111(a) with claiming the benefit of U.S. provisional application Ser. No. 60/632,986 filed Dec. 6, 2004 and U.S. provisional application Ser. No. 60/653,996 filed Feb. 18, 2005 under the provision of 35 U.S.C. 111(b), pursuant to 35 U.S.C. Section 119(e) (1).

TECHNICAL FIELD

The present invention relates to an illumination source using a light emitting diode (LED), an illuminator, and a backlight for a liquid crystal display.

BACKGROUND ART

Light emitting diode devices are improved remarkably in terms of light emitting efficiency and are free from mercury which is a toxic substance, whereby use thereof for illumination instead of conventional fluorescent lamps has energetically been studied in recent years. It is preferred that an illumination source emits a light having a spectral distribution close to that of sunlight. Thus, it is preferred that the illumination source has a flat spectral distribution containing components with every wavelength in the optical region. As white light source using light emitting diode devices, those obtained by a combination of three light emitting diodes for red, green, and blue emission or a combination of a light emitting diode for blue to ultraviolet emission and a photoluminescent material which absorbs the light emission, to thereby emit light from red to green, have been used. Examples of the former include so-called a three-in-one LED light source in which LEDs for red (AlInGaP), green (InGaN) and blue (InGaN) are included in one unit, and examples of the latter include a light source in which an InGaN-based blue LED and a so-called YAG fluorescent material to absorb a blue light to thereby produce a yellow fluorescence are combined.

DISCLOSURE OF THE INVENTION

However, conventional LED light sources do not have flat spectral distributions and do not include sufficient components for all wavelengths. For example, since a typical example of a spectral distribution curve of a three-in-one type light source as shown in FIG. 4 has sharp peaks within the blue, green, and red wavelength regions and deep valleys between the peaks, it is difficult for such a light source to show colors with wavelengths corresponding to the valleys when used for illumination.

Further, white light sources using a so-called YAG fluorescent material and a blue LED in combination have widely been used as backlights for liquid crystal displays of cellular phones. However, since such a light source has a spectral distribution with only components for blue and its complementary color, yellow as shown in FIG. 3, it is difficult for the light source to show red particularly. In order to improve the distribution, many attempts to develop a fluorescent material for red emission and to mix fluorescent materials for multiple colors have been made. However, it is difficult to mix fluorescent materials with different crystal structures, and therefore attempts to obtain a satisfactory flat spectral distribution have been unsuccessful.

Accordingly, an object of the present invention is to provide an LED light source having excellent properties for illumination, which has a flat spectral distribution within the green to red wavelength region and has a sufficient emission intensity also in the red region.

The inventors have made intense researches in view of using a light emitting diode as a light source in combination with a multiple kinds of photoluminescent materials to obtain an LED light source having a flat spectral distribution. As a result, the inventors have found out that excellent spectral distribution properties can be obtained by using iridium complexes as photoluminescent materials, and thereby the present invention have been accomplished. Since the iridium complexes used in the invention have chemical structures similar to each other even if they emit different colors, they can be mixed with each other at an arbitrary ratio. Therefore, by mixing multiple kinds of iridium complexes having different emission peak wavelengths, an LED light source having a flat spectral distribution in the green to red regions can be constituted.

Thus, the invention includes the following light emitting diode illumination source, illuminator and backlight for a liquid crystal display.

1. A light emitting diode illumination source, comprising a light emitting diode having multiple peaks with a half-value width of 20 nm or more within a range from 480 to 700 nm in a spectral distribution, wherein the minimum of the intensities of the valleys between the peaks in the wavelength range from 480 to 700 nm is 65% or more of the maximum peak intensity in the same range.

2. The light emitting diode illumination source according to 1, wherein the emission intensity at 650 nm is 50% or more of the maximum peak intensity in the range of 480 to 700 nm.

3. The light emitting diode illumination source according to 1 or 2, which is obtained by forming a photoluminescent material on a light emitting diode chip.

4. The light emitting diode illumination source according to 1 or 2, comprising a light emitting diode chip and a photoluminescent material formed thereon.

5. The light emitting diode illumination source according to 3, wherein the photoluminescent material is an iridium complex.

6. The light emitting diode illumination source according to 4, wherein the photoluminescent material is an iridium complex.

7. The light emitting diode illumination source according to 5, wherein the iridium complex is a mixture of 2 or more iridium complexes represented by formula (1) with an arbitrary mixing ratio.

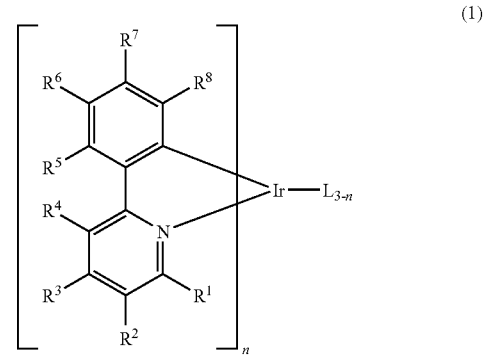

(In the formula, $R^1$ to $R^8$ each independently represents a hydrogen atom, a halogen atom, or an organic group having 1 to 15 carbon atoms, those adjacent to each other among the $R^1$ to $R^8$ substituents may be bonded with each other at 1 or more positions to form a condensed ring, n is 2 or 3, two or three ligands shown in [ ] may be the same or different ones, and L represents a bidentate organic ligand bonded to iridium via atoms other than carbon atom.)

8. The light emitting diode illumination source according to 6, wherein the iridium complex is a mixture of 2 or more iridium complexes represented by formula (1) with an arbitrary mixing ratio.

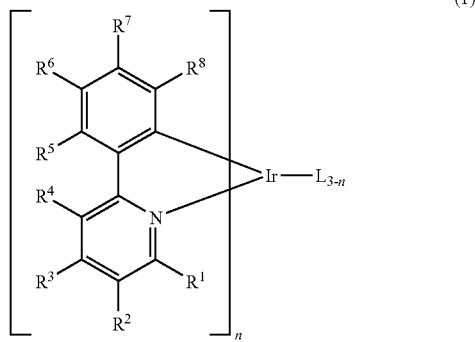

(1)

(All the symbols in the formula have the same meanings as defined above.)

9. The light emitting diode illumination source according to any one of 1 to 8, wherein the light emitting diode is a blue light emitting diode having a dominant wavelength of 430 to 480 nm.

10. An illuminator using the light emitting diode illumination source according to any one of 1 to 8.

11. A backlight for a liquid crystal display, using the light emitting diode illumination source according to any one of 1 to 8.

The light emitting diode illumination source of the present invention has a flat spectral distribution containing light components with all wavelengths in green to red regions, and thereby can achieve illumination close to natural light, extremely suitable for observing object colors. Further, the photoluminescent materials can be mixed at an arbitrary ratio to control the spectral distribution, so that the illumination light source can be designed according to use and is remarkably useful.

BEST MODE FOR CARRYING OUT THE INVENTION

Figure 1:
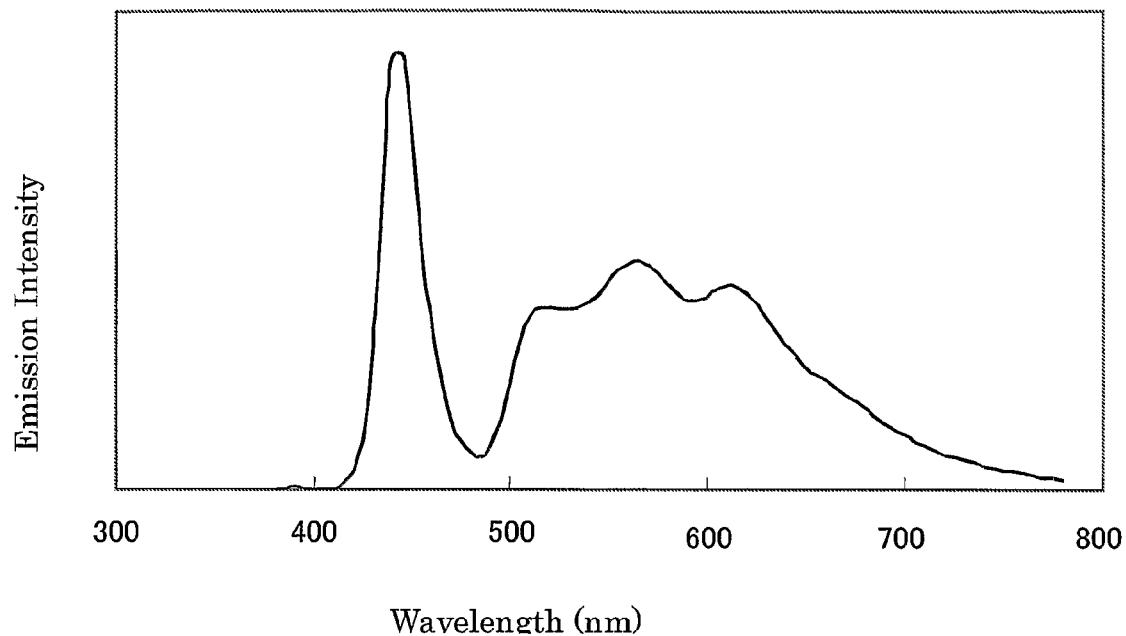
FIG. 1 is a spectral distribution curve of an LED illumination source according to an example of the present invention.

The present invention is described in more detail below.

The light emitting diode illumination source of the invention comprises a light emitting diode having multiple peaks with a half value width of 20 nm or more within a range of 480 to 700 nm in the spectral distribution, and the minimum of the intensities of the valleys between the peaks in the wavelength range of 480 to 700 nm is 65% or more of the maximum peak intensity in the range.

In the range of 480 to 700 nm in the spectral distribution, there are 2 or more peaks with the half value width of 20 nm or more, preferably 3 or more such peaks, more preferably 4 or more such peaks.

When there is only one such peak, it is difficult to obtain a flat spectral distribution.

Moreover, the half value widths of the peaks are 20 nm or more, preferably 50 nm or more. The peak with a half value width of less than 20 nm makes a spectrum close to a bright line spectrum, which is not preferred in that colors around such peaks look odd.

Further the minimum intensity of the intensities in the valleys between the peaks in the above wavelength range is required to be 65% or more, preferably 80% or more, of the maximum peak intensity in the range of 480 to 700 nm. When the minimum intensity in the valleys is less than 65%, some hues, within a range from 5B to 10R in a counterclockwise direction, in the hue circle of JIS standard color chart, are imperceptible, therefore it is not preferred.

The emission intensity at 650 nm of the illumination source of the invention is preferably 50% or more, more preferably 55% or more, of the maximum peak intensity in the range of 480 to 700 nm. When the intensity is less than 50% of the maximum peak intensity, some hues, within a range from 10R to 5B in a counterclockwise direction, in the hue circle of JIS standard color chart, are imperceptible, therefore it is not preferred.

The light emitting diode illumination source of the invention can be obtained by using a light emitting diode device (LED) for ultraviolet to blue emission in combination with multiple photoluminescent materials that absorb a light in the wavelength region to emit a light.

The photoluminescent material (a fluorescent material or a phosphorescent material) absorbs light produced by an LED, to thereby emit light, and generally has an emission spectrum with a half value width of 20 nm or more. An illumination source having a flat spectral distribution can be obtained by forming a mixture of two or more types of such photoluminescent materials on an LED chip. It is preferable that three or more types of such photoluminescent materials be formed on the LED chip, more preferably four or more types.

In the invention, the light emitting diode device for ultraviolet to blue emission is preferably an InGaN-, AlGaN-, or GaN-based light emitting diode device. Since LEDs for ultraviolet emission have short life because of deterioration of sealing resins caused by ultraviolet ray, an InGaN- or GaN-based blue light emitting diode device is particularly preferred.

As photoluminescent materials, iridium complexes are preferred, and at least one of the iridium complexes is preferably a compound represented by formula (1).

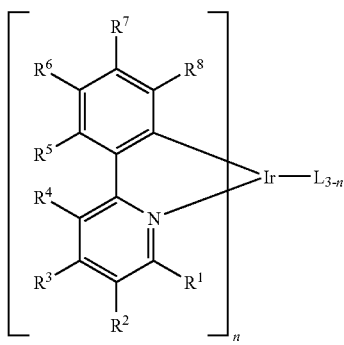

(1)

In the formula, $R^1$ to $R^8$ each independently represents a hydrogen atom, a halogen atom or an organic group having 1 to 15 carbon atoms, those adjacent to each other among the $R^1$ to $R^8$ substituents may be bonded with each other at 1 or more positions to form a condensed ring, n is an integer of 2 or 3, two or more ligands shown in [ ] may be the same or different ones, and L represents a bidentate organic ligand bonded to iridium via atoms other than carbon atom.

Examples of the organic group having 1 to 15 carbon atoms in formula (1) include alkyl groups having 1 to 10 carbon atoms (such as a methyl group, an ethyl group, a propyl group, an isopropyl group, a butyl group, an isobutyl group, a t-butyl group, an amyl group, a hexyl group, an octyl group, and a decyl group), aryl groups having 6 to 10 carbon atoms (such as a phenyl group, a tolyl group, a xylyl group, a mesityl group, and a naphthyl group), amino groups which may be substituted by an alkyl group having 1 to 10 carbon atoms (such as an amino group, a dimethylamino group, a diethylamino group, and a dibutylamino group), alkoxy groups having 1 to 10 carbon atoms (such as a methoxy group, an ethoxy group, a propoxy group, an isopropoxy group, a butoxy group, an isobutoxy group, a t-butoxy group, a hexyloxy group, a 2-ethylhexyloxy group, and a decyloxy group), and silyl groups (such as a trimethylsilyl group, a triethylsilyl group, and a t-butyldimethylsilyl group). Further, example of the halogen atoms include a fluorine atom, a chlorine atom, a bromine atom and an iodine atom.

Among the substituents of $R^1$ to $R^8$ on the phenylpyridine ring in formula (1), adjacent substituents may be bonded together at 1 or more positions to form a condensed ring. Examples of the pyridine ring or the benzene ring forming a condensed ring include a quinoline ring, an isoquinoline ring, a naphthalene ring, an anthracene ring, a phthalazine ring, a quinazoline ring and a quinoxaline ring, and examples of the condensed rings formed by the phenylpyridine ring include a benzoquinoline ring and a dibenzoquinoline ring.

The bidentate organic ligand L in formula (1) preferably has a structural formula selected from structures as represented by formula (2):

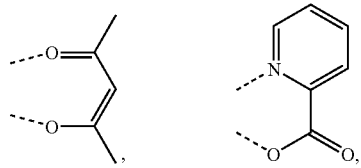

(2)

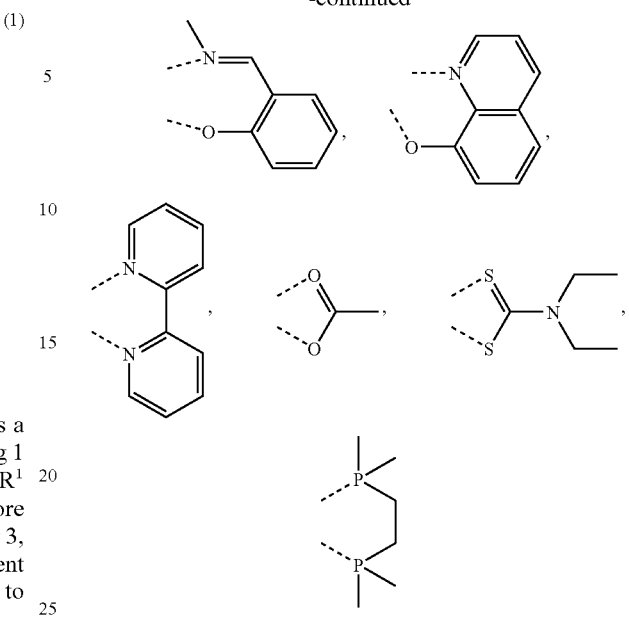

(wherein a dashed line represents a position to be bonded to iridium, and carbon atoms in each ligand may be substituted by an organic group having 1 to 15 carbon atoms.) Specific examples of the organic groups having 1 to 15 carbon atoms in formula (2) include those as mentioned in relation to formula (1).

Specific examples of the iridium complexes represented by formula (1) include those having structures represented by formulae (E1) to (E20).

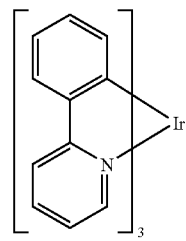

(E1)

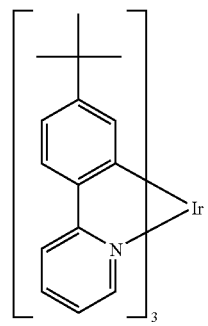

(E2)

-continued
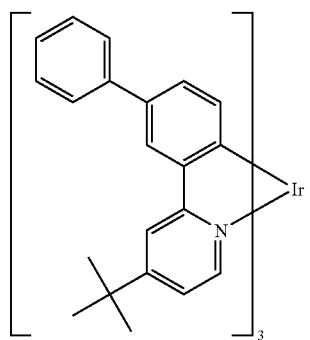
(E3)
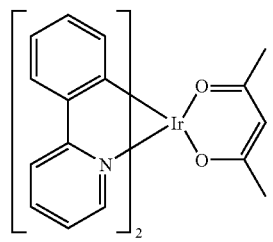
(E4)
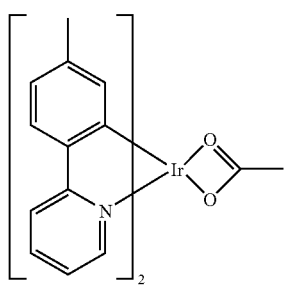
(E5)
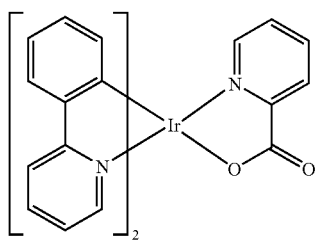
(E6)
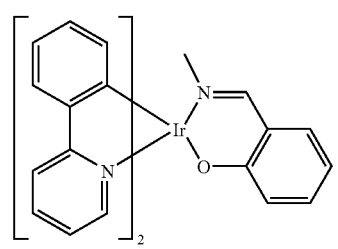
(E7)
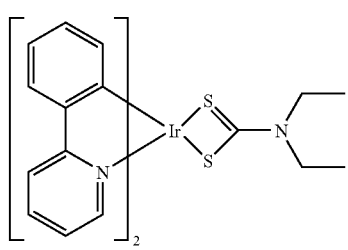
(E8)
-continued
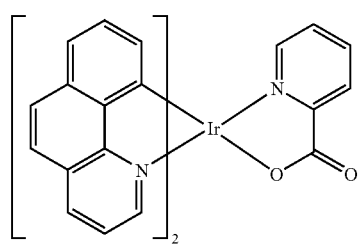
(E9)
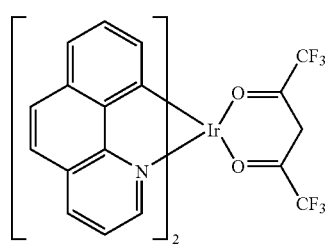
(E10)
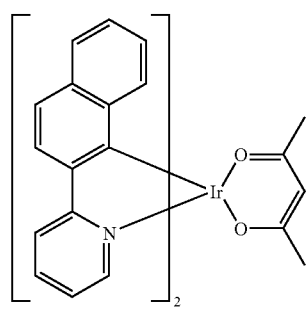
(E11)
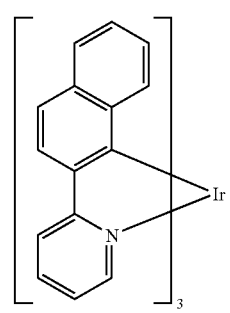
(E12)
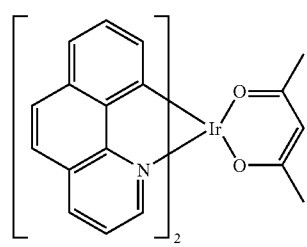
(E13)
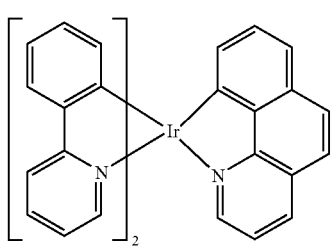
(E14)

-continued
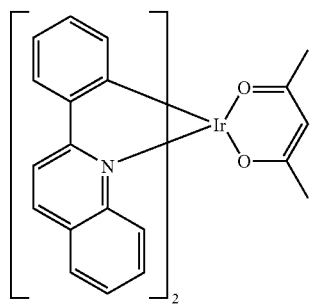
(E15)
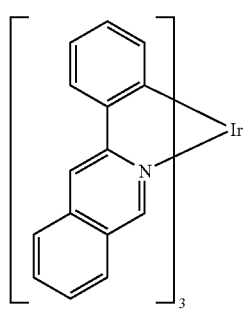
(E16)
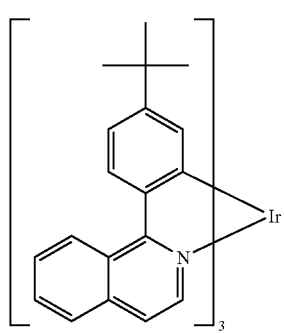
(E17)
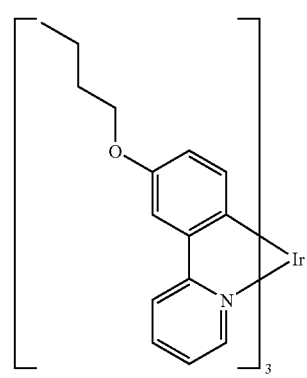
(E18)
-continued
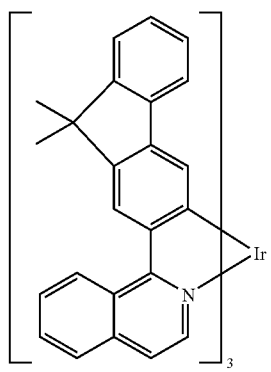
(E19)
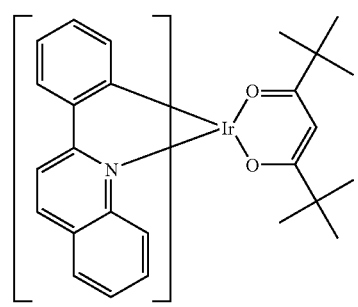
(E20)
Further, a luminescent iridium complex other than those represented by the formula (1) may be used as a photoluminescent material in the invention. Examples of such luminescent iridium complexes include those having structures represented by the following formulae (E21) to (E32).
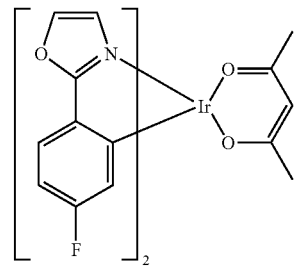
(E21)
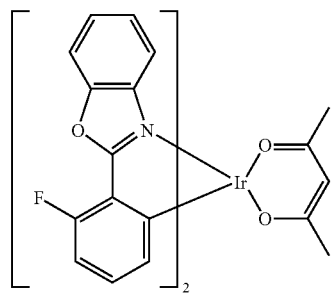
(E22)

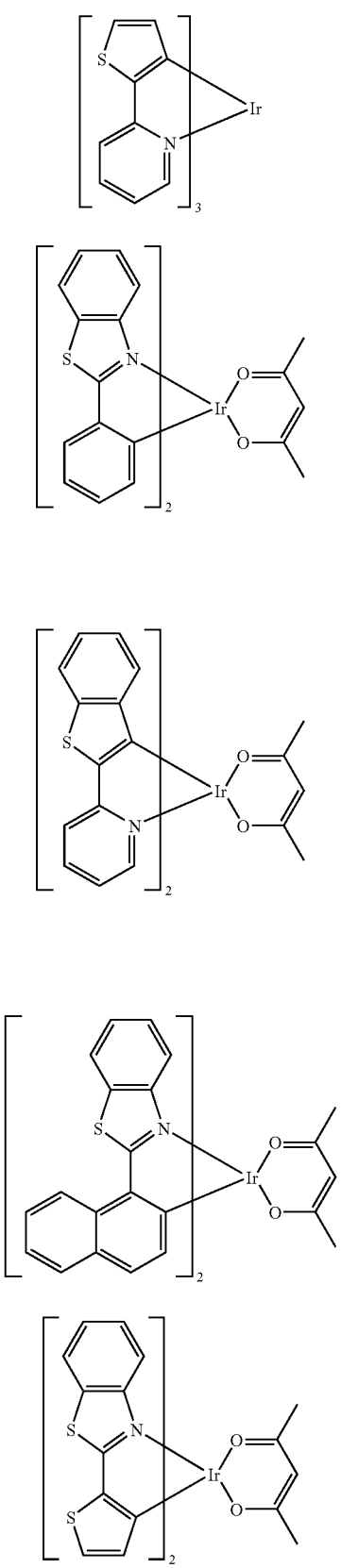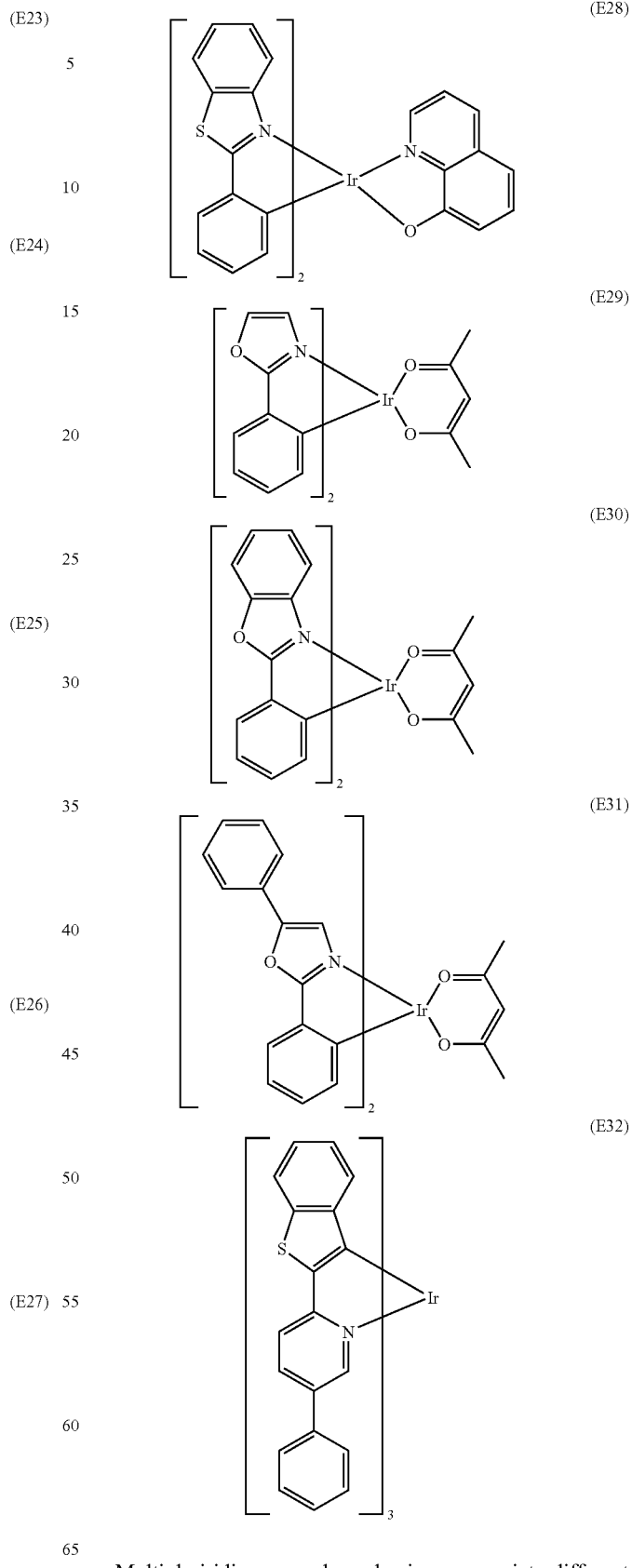
Multiple iridium complexes having appropriate different emission peak wavelengths may be mixed to make the spectral distribution flat. Examples of 3-type combinations of the iridium complexes, if mentioned by referring to numbers of the above-mentioned formulae, include (E2)+(E17)+(E14), (E2)+(E17)+(E16), and (E2)+(E14)+(E16).

Further, examples of 4-type combination include (E2)+(E17)+(E14)+(E16).

The mixing ratio of the iridium complexes may be determined depending on purposes of the light source, and for example, when the light source is used for general lighting, the ratio is preferably within the range of E2:E17:E16=from 50 to 80%:from 3 to 10%:from 10 to 30%. Moreover, in order that the emission intensity at 650 nm is 50% or more of the peak intensity, 1 to 10% of the iridium complex E17 must be added as a red component.

In the invention, the photoluminescent material may be used independently or may be used as a dispersion or solution in a binder as described later. Although the photoluminescent material may be disposed at any position of constructional elements as long as the material can be irradiated with a light emitted from the LED light source, it is preferable that a surface of the LED device be coated with the photoluminescent material and the binder.

The binder is generally a thermosetting resin though the binder is not particularly limited as long as it can dissolve or disperse the complex. Examples of the thermosetting resins include polycarbonate resins, polyethersulfone resins, polyacrylate resins, acryl resins, polyvinyl acetal resins, epoxy resins, cyanate resins, phenol resins, polyimide resins, urethane resins and silicone resins. Among the resins, transparent epoxy resin is most preferable from the viewpoints of high transparency and excellent practical characteristics such as adhesiveness.

Examples of the transparent epoxy resin include an epoxy resin such as bisphenol A diglycidyl ether, 2,2-bis(4-glycidyloxycyclohexyl)propane, 3,4-epoxycyclohexylmethyl-3,4-epoxyhexane carboxylate, vinylcyclohexene dioxide, 2-(3,4-epoxycyclohexane)-5,5-spiro-(3,4-epoxycyclohexane)-1,3-dioxane, bis(3,4-epoxycyclohexyl)adipate, 1,2-cyclopropanedicarboxylic acid bisglycidyl ester, triglycidyl isocyanurate, monoallyl diglycidyl isocyanurate or diallyl monoglycidyl isocyanurate, which is cured by an acid anhydride such as hexahydrophthalic anhydride, methylhexahydrophthalic anhydride, trialkyltetrahydrophthalic anhydride or hydrogenated methylnadic anhydride. One of these epoxy resins or curing agents may be used singly or two or more of them may be used in combination.

EXAMPLES

The present invention will be described in more detail below with reference to Examples and Comparative Examples, however the invention is by no means limited by the Examples.

Example 1

An InGaN light emitting diode chip having a dominant emission wavelength of 455 nm and an emission output of 4.6 mW was mounted in a surface mount package of 3 mm×2.5 mm×2.5 mm in outer size. Then, 4.9 mg of the iridium complex (E2), 0.4 mg of (E17), and 1.7 mg of (E16) were dispersed in 10 g of an epoxy resin (refractive index 1.6, EL438 available from Sanyu Rec Co. Ltd.), poured into a concavity of the surface mount package, and heat-treated at 120° C. for 4 hours to cure the resin, whereby a photoluminescent layer was formed.

The obtained LED light source was energized at 3.27 V and 20 mA and lighted. The emission spectrum thereof is shown in FIG. 1. There were three peaks in the wavelength region of 480 to 700 nm, and the maximum intensity was at 575 nm. There were two valleys between the peaks, and the minimum intensity was at 530 nm. The ratio of the intensities was 100:78. The emission intensity at 650 nm was 55% of the maximum intensity in the wavelength region of 480 to 700 nm.

Further, the spectrum curve in the wavelength region of 500 nm or more, where the emission spectra of (E2), (E17), and (E16) were overlapped, was decomposed to three components by a data analysis software PeakFit (manufactured by SYSTAT Software Inc.), and the resulting three spectra had half value widths of approximately 50 nm, 70 nm and 90 nm, respectively.

This LED lamp was used for illumination, and the hue 2.5R defined by JIS standard was visually observed. All the color grades other than those represented by the sign x in Table 1 were perceptible.

TABLE 1

| | | \multicolumn{9}{c}{Chroma} | | | | | | | |
|---|---|---|---|---|---|---|---|---|---|---|
| | | N | 1 | 2 | 3 | 4 | 6 | 8 | 10 | 12 | 14 |
| value | 9 | | | | ▓ | ▓ | ▓ | ▓ | ▓ | ▓ | ▓ |
| | 8 | | | | | | | ▓ | ▓ | ▓ | ▓ |
| | 7 | | | | | | | | | ▓ | ▓ |
| | 6 | | | | | | | | | | |
| | 5 | | | | | | | | | x | x |
| | 4 | | | | | | | | | | |
| | 3 | | | | | | | | | | |
| | 2 | | | | | | | | | | |

N: Achromatic
Shaded zone: Not included in the color plates of the 2.5R hue according to JIS Z8721 standard color system Example 2

An InGaN light emitting diode chip having a dominant emission wavelength of 455 nm and an emission output of 4.6 mW was mounted in a surface mount package of 3 mm×2.5 mm×2.5 mm in outer size. Then, 4.9 mg of the iridium complex (E2), 0.5 mg of (E17), 0.6 mg of (E14), and 1.0 mg of (E16) were dispersed in 10 g of an epoxy resin (refractive index 1.6, EL438 available from Sanyu Rec Co. Ltd.), charged into a concavity of the surface mount package, and heat-treated at 120° C. for 4 hours to cure the resin, whereby a photoluminescent layer was formed.

Figure 2:
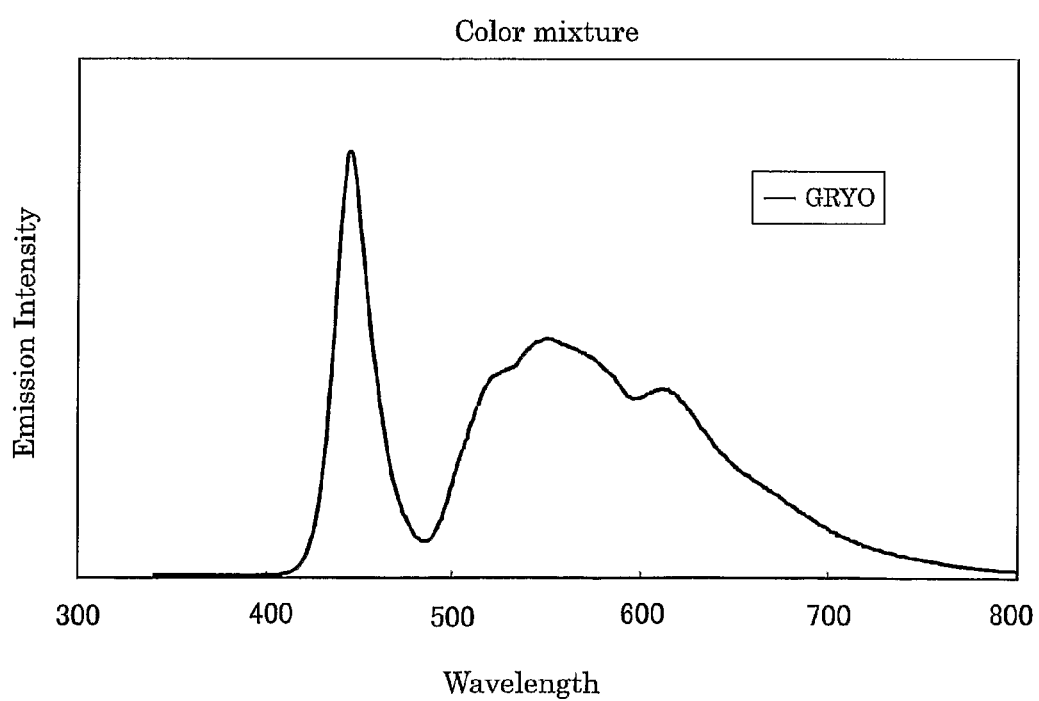
FIG. 2 is a spectral distribution curve of an LED illumination source according to another example of the invention.

The obtained LED light source was energized at 3.27 V and 20 mA and lighted. The emission spectrum thereof is shown in FIG. 2. There were four peaks in the wavelength region of 480 to 700 nm, and the maximum intensity was at 553 nm. There were three valleys between the peaks, and the minimum intensity was at 597 nm. The ratio of the intensities was 100:75. The emission intensity at 650 nm was 51% of the maximum intensity in the wavelength region of 480 to 700 nm.

Further, as a result of measuring half value widths in the same manner as Example 1, the widths were approximately 50 nm, 70 nm, and 90 nm, respectively.

This LED lamp was used for illumination, and the hue 2.5R defined by JIS standard was visually observed. All the color grades in Table 2 were perceptible.

TABLE 2

| | | Chroma | | | | | | | | |
|---|---|---|---|---|---|---|---|---|---|---|
| | | N | 1 | 2 | 3 | 4 | 6 | 8 | 10 | 12 | 14 |
| value | 9 | | | | | | | | | | |
| | 8 | | | | | | | | | | |
| | 7 | | | | | | | | | | |
| | 6 | | | | | | | | | | |
| | 5 | | | | | | | | | | |
| | 4 | | | | | | | | | | |
| | 3 | | | | | | | | | | |
| | 2 | | | | | | | | | | |

N: Achromatic
Shaded zone: Not included in the color plates of the 2.5R hue according to JIS Z8721 standard color system Comparative Example 1

A white LED light source (model number: NCCWO23T, manufactured by Nichia Corporation) using a YAG fluorescent material as a photoluminescent material was subjected to JIS color vision tests in the same manner as Example 1. The results are shown in Table 3. There were imperceptible color grades in a wide range from orange to red.

Figure 3:
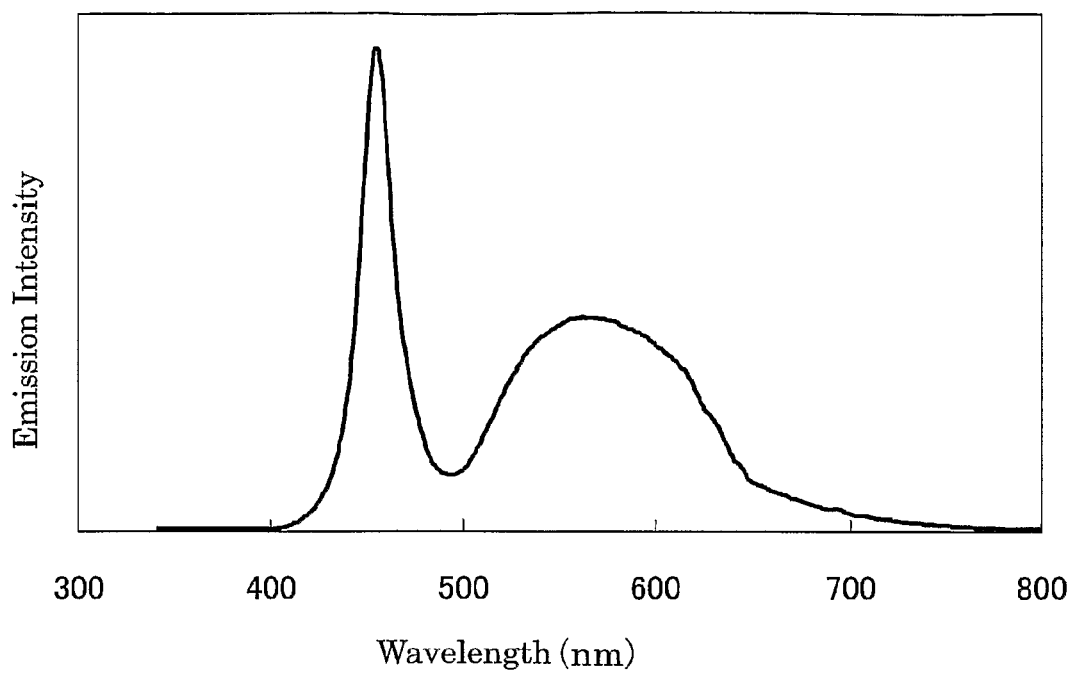
FIG. 3 is a spectral distribution curve of an LED illumination source of a comparative example.

Further, the emission spectrum is shown in FIG. 3. There was one peak in the wavelength region of 480 to 700 nm, and the maximum intensity was at 570 nm. The emission intensity at 650 nm was 52% of the maximum intensity in the wavelength region of 480 to 700 nm.

TABLE 3

| | | Chroma | | | | | | | | |
|---|---|---|---|---|---|---|---|---|---|---|
| | | N | 1 | 2 | 3 | 4 | 6 | 8 | 10 | 12 | 14 |
| value | 9 | | | | | | | | | | |
| | 8 | | | | | | | | | | |
| | 7 | | | | | | | | | | |
| | 6 | | | | | | | | | x | |
| | 5 | | | | | | | x | x | x | x |
| | 4 | | | | | | | x | x | x | x |
| | 3 | | | | | | | | x | x | |
| | 2 | | | | | | | | | | |

N: Achromatic
Shaded zone: Not included in the color plates of the 2.5R hue according to JIS Z8721 standard color system Comparative Example 2

A three-in-one-type white LED light source (UVGB1306L manufactured by Stanley Electric Co., Ltd.), where three LEDs for blue, red, and green emission were mounted in a single package, was subjected to JIS color vision tests in the same manner as Example 1. The results are shown in Table 4. There were imperceptible color grades over a wide orange to red region

TABLE 4

| | | Chroma | | | | | | | | |
|---|---|---|---|---|---|---|---|---|---|---|
| | | N | 1 | 2 | 3 | 4 | 6 | 8 | 10 | 12 | 14 |
| value | 9 | | | | | | | | | | |
| | 8 | | | | | | | | | | |
| | 7 | | | | | | | | | | |
| | 6 | | | | | | | | | x | |
| | 5 | | | | | | | x | x | x | x |
| | 4 | | | | | | | | x | x | x |
| | 3 | | | | | | | | x | x | |
| | 2 | | | | | | | | | | |

Figure 4:
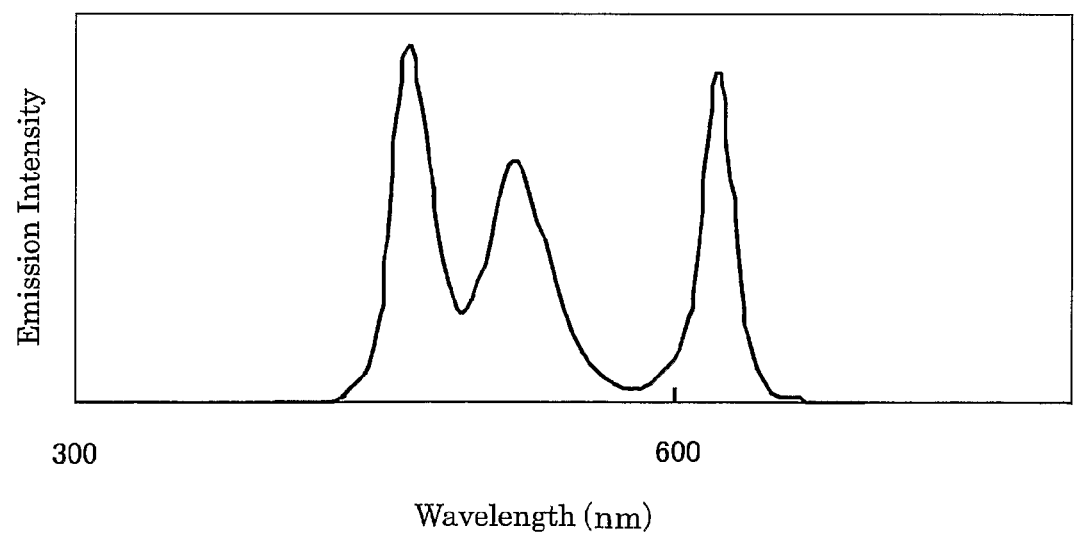
FIG. 4 is a spectral distribution curve of an LED illumination source of a comparative example.

N: Achromatic
Shaded zone: Not included in the color plates of the 2.5R hue according to JIS Z8721 standard color system Further, the emission spectrum is shown in FIG. 4. There were two peaks in the wavelength region of 480 to 700 nm, and the maximum intensity was at 623 nm. There were two valleys between the peaks, and the minimum intensity was at 582 nm. The ratio of the intensities was 26:1. The emission intensity at 650 nm was 3% of the maximum intensity in the wavelength region of 480 to 700 nm.

The invention claimed is:

1. A light emitting diode illumination source, comprising a light emitting diode having multiple peaks with a half-value width of 20 nm or more within a range from 480 to 700 nm in a spectral distribution, wherein the minimum of the intensities of the valleys between the peaks in the wavelength range from 480 to 700 nm is 65% or more of the maximum peak intensity in the same range.

2. The light emitting diode illumination source according to claim 1, wherein the emission intensity at 650 nm is 50% or more of the maximum peak intensity in the range of 480 to 700 nm.

3. The light emitting diode illumination source according to claim 1, which is obtained by forming a photoluminescent material on a light emitting diode chip.

4. The light emitting diode illumination source according to claim 1, comprising a light emitting diode chip and a photoluminescent material formed thereon.

5. The light emitting diode illumination source according to claim 3, wherein the photoluminescent material is an iridium complex.

6. The light emitting diode illumination source according to claim 4, wherein the photoluminescent material is an iridium complex.

7. The light emitting diode illumination source according to claim 5, wherein the iridium complex is a mixture of 2 or more iridium complexes represented by formula (1) with an arbitrary mixing ratio,

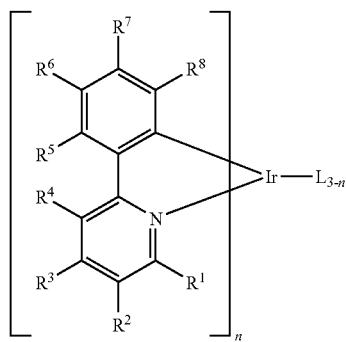

(1)

wherein $R^1$ to $R^8$ each independently represents a hydrogen atom, a halogen atom, or an organic group having 1 to 15 carbon atoms, those adjacent to each other among the $R^1$ to $R^8$ substituents may be bonded with each other at 1 or more positions to form a condensed ring, n is 2 or 3, two or three ligands shown in [ ] may be the same or different ones, and L represents a bidentate organic ligand bonded to iridium via atoms other than carbon atom.

8. The light emitting diode illumination source according to claim 6, wherein the iridium complex is a mixture of 2 or more iridium complexes represented by formula (1) with an arbitrary mixing ratio,

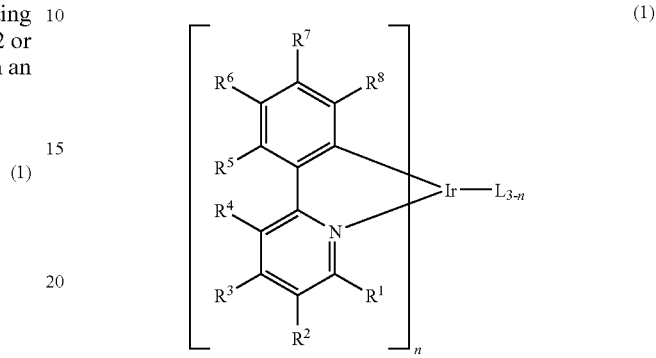

(1)

wherein all the symbols have the same meanings as defined in claim 7.

9. The light emitting diode illumination source according to claim 1, wherein the light emitting diode is a blue light emitting diode having a dominant wavelength of 430 to 480 nm.

10. An illuminator using the light emitting diode illumination source according to claim 1.

11. A backlight for a liquid crystal display, using the light emitting diode illumination source according to claim 1.

* * * * *

UNITED STATES PATENT AND TRADEMARK OFFICE
CERTIFICATE OF CORRECTION

| | | |
|---|---|---|
| PATENT NO. | : 7,737,434 C1 | Page 1 of 1 |
| APPLICATION NO. | : 90/020041 | |
| DATED | : May 28, 2014 | |
| INVENTOR(S) | : Kenji Shinozaki et al. | |

It is certified that error appears in the above-identified patent and that said Letters Patent is hereby corrected as shown below:

In the claims

Column 18, Claim 12, lines 10-11:

delete

"wherein the photoluminescent material is a mixture of four iridium complexes with an arbitrary mixing ration"

and insert

-- wherein the photoluminescent material is a mixture of four iridium complexes with an arbitrary mixing ratio --

Signed and Sealed this
Second Day of February, 2016

Michelle K. Lee
*Director of the United States Patent and Trademark Office*

(12) EX PARTE REEXAMINATION CERTIFICATE (10177th)
United States Patent
Shinozaki et al.

(10) Number: US 7,737,434 C1
(45) Certificate Issued: May 28, 2014

(54) LIGHT-EMITTING DIODE ILLUMINATION SOURCE

(75) Inventors: Kenji Shinozaki, Chiba (JP); Kenzo Hanawa, Chiba (JP); Tsuyoshi Kato, Chiba (JP); Yoshiaki Takahashi, Chiba (JP)

(73) Assignee: Showa Denko K.K., Minato-Ku, Tokyo (JP)

Reexamination Request:
No. 90/020,041, Nov. 19, 2013

Reexamination Certificate for:
Patent No.: 7,737,434
Issued: Jun. 15, 2010
Appl. No.: 11/667,951
Filed: May 17, 2007

(21) Appl. No.: 90/020,041

(22) PCT Filed: Nov. 22, 2005

(86) PCT No.: PCT/JP2005/021935
§ 371 (c)(1),
(2), (4) Date: May 17, 2007

(87) PCT Pub. No.: WO2006/057421
PCT Pub. Date: Jun. 1, 2006

Related U.S. Application Data

(60) Provisional application No. 60/653,996, filed on Feb. 18, 2005, provisional application No. 60/632,986, filed on Dec. 6, 2004.

(30) Foreign Application Priority Data

Nov. 25, 2004 (JP) .................................. 2004-339801
Feb. 9, 2005 (JP) .................................. 2005-032408

(51) Int. Cl.
*H01L 35/24* (2006.01)
*H01L 29/22* (2006.01)

(52) U.S. Cl.
USPC .................. 257/40; 257/79; 257/98; 257/103

(58) Field of Classification Search
None
See application file for complete search history.

(56) References Cited

To view the complete listing of prior art documents cited during the proceeding for Reexamination Control Number 90/020,041, please refer to the USPTO's public Patent Application Information Retrieval (PAIR) system under the Display References tab.

*Primary Examiner* — Erik Kielin

(57) ABSTRACT

The invention provides light emitting diode illumination source having excellent properties as an illumination source such as a flat spectral distribution in the wavelength region from green to red and a sufficient emission intensity in the red region, comprising a light emitting diode having multiple peaks with a half-value width of 20 nm or more within a range from 480 to 700 nm in a spectral distribution, wherein the minimum of the intensities of the valleys between the peaks in the wavelength range from 480 to 700 nm is 65% or more of the maximum peak intensity in the same range, and an illuminator and a backlight for a liquid crystal display using the illumination source.

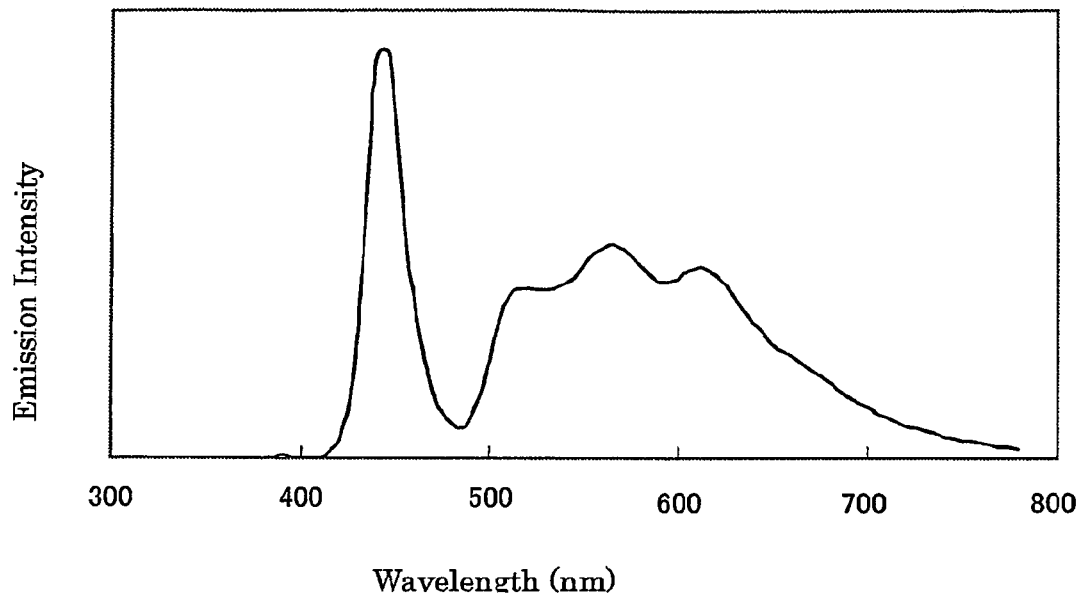

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 3-8 are cancelled.

Claim 1 is determined to be patentable as amended.

Claims 2 and 9-11, dependent on an amended claim, are determined to be patentable.

New claims 12-16 are added and determined to be patentable.

1. A light emitting diode illumination source, comprising a light emitting diode having multiple peaks with a half-value width of 20 nm or more within a range from 480 to 700 nm in a spectral distribution, wherein the minimum of the intensities of the valleys between the peaks in the wavelength range from 480 to 700 nm is 65% or more of the maximum peak intensity in the same range,
   *wherein the light emitting diode is a chip having a photoluminescent material thereon,*
   *wherein the photoluminescent material is a mixture of three iridium complexes with an arbitrary mixing ratio, and*
   *wherein the iridium complexes are selected from iridium complexes represented by following formulae (E2), (E14), (E16) and (E17):*

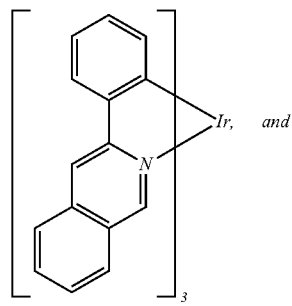

(E2)

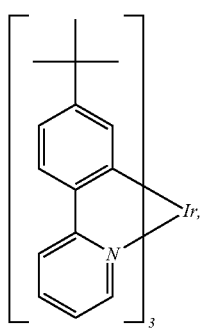

(E14)

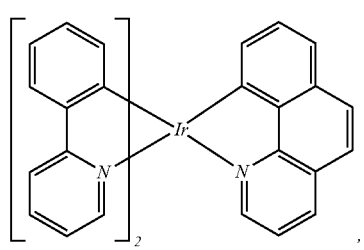

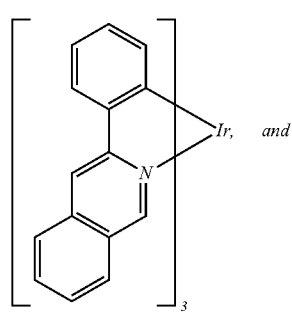

(E16)

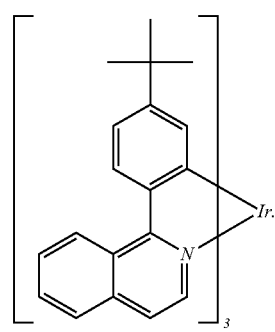

(E17)

12. *A light emitting diode illumination source, comprising a light emitting diode having multiple peaks with a half-value width of 20 nm or more within a range from 480 to 700 nm in a spectral distribution, wherein the minimum of the intensities of the valleys between the peaks in the wavelength range from 480 to 700 nm is 65% or more of the maximum peak intensity in the same range,*
   *wherein the light emitting diode is a chip having a photoluminescent material thereon,*
   *wherein the photoluminescent material is a mixture of four iridium complexes with an arbitrary mixing ration, and*
   *wherein the iridium complexes are represented by following formulae (E2), (E14), (E16) and (E17):*

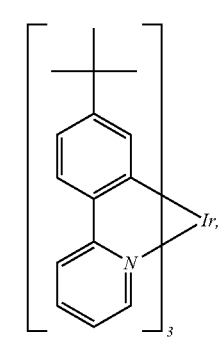

(E2)

-continued

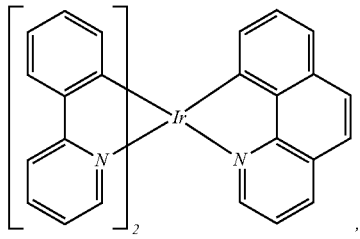
(E14)

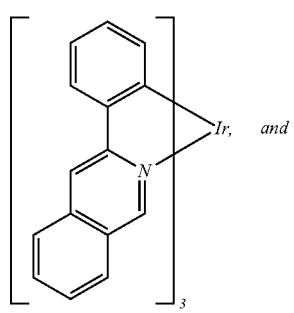
(E16)

-continued

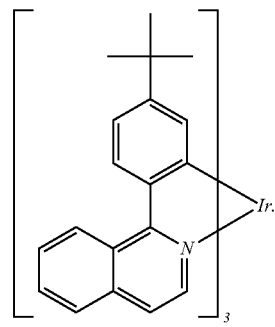
(E17)

13. The light emitting diode illumination source according to claim 12, wherein the emission intensity at 650 nm is 50% or more of the maximum peak intensity in the range of 480 to 700 nm.

14. The light emitting diode illumination source according to claim 12, wherein the light emitting diode is a blue light emitting diode having a dominant wavelength of 430 to 480 nm.

15. An illuminator using the light emitting diode illumination source according to claim 12.

16. A backlight for a liquid crystal display, using the light emitting diode illumination source according to claim 12.

* * * * *